(12) United States Patent
Jaquez-Vazquez et al.

(10) Patent No.: US 9,336,337 B2
(45) Date of Patent: May 10, 2016

(54) ONLINE FRAME LAYOUT TOOL

(75) Inventors: Carmen Jasmine Jaquez-Vazquez, Shoreview, MN (US); Montana Scheff, Minneapolis, MN (US); Kristen Hasler, Minneapolis, MN (US)

(73) Assignee: Target Brands, Inc., Minneapolis, MN (US)

(*) Notice: Subject to any disclaimer, the term of this patent is extended or adjusted under 35 U.S.C. 154(b) by 477 days.

(21) Appl. No.: 13/368,782

(22) Filed: Feb. 8, 2012

(65) Prior Publication Data
US 2013/0204584 A1 Aug. 8, 2013

(51) Int. Cl.
*G06G 7/48* (2006.01)
*G06F 17/50* (2006.01)
*G06Q 30/06* (2012.01)

(52) U.S. Cl.
CPC ........ *G06F 17/5004* (2013.01); *G06Q 30/0621* (2013.01)

(58) Field of Classification Search
CPC .................................................. G06Q 30/0621
USPC ............................................................ 703/6
See application file for complete search history.

(56) References Cited

U.S. PATENT DOCUMENTS

| | | | |
|---|---|---|---|
| 2001/0034668 A1* | 10/2001 | Whitworth | G06Q 30/06 705/26.3 |
| 2004/0006515 A1 | 1/2004 | Brey et al. | |
| 2006/0122915 A1* | 6/2006 | Allen | G06Q 30/0601 705/26.1 |
| 2007/0067179 A1* | 3/2007 | Kerr | G06Q 20/20 705/16 |
| 2009/0125421 A1 | 5/2009 | Ettlinger et al. | |

OTHER PUBLICATIONS

Office Action from Canadian Patent Application No. 2,794,024, mailed May 2, 2013 (3 pages).
Office Action from Canadian Patent Application No. 2,794,924 mailed Aug. 8, 2014 (5 pages).

* cited by examiner

*Primary Examiner* — Hugh Jones
(74) *Attorney, Agent, or Firm* — Griffiths & Seaton PLLC; JoAnn M. Seaton

(57) ABSTRACT

An online frame layout tool is provided that displays a plurality of wall shape parameter selections, displays predetermined frame layout options, in response to receiving a first wall shape parameter selection, each predetermined frame layout option including a representation of a plurality of frames having two or more frame images of different shapes and sizes being arranged in a predetermined pattern, and supplies one or more links to a retailer website, in response to receiving a selected predetermined frame layout option chosen from the predetermined frame layout options, the one or more links being related to information for purchasing one or more products represented by the two or more frame images included in the representation of the plurality of frames associated with the selected predetermined frame layout option.

21 Claims, 13 Drawing Sheets

ONLINE FRAME LAYOUT TOOL

BACKGROUND OF THE INVENTION

On-line (e.g., Internet) advertising, shopping, and brand promotion continues to grow in popularity. Retailers occasionally join forces with other non-retail entities to promote and extend their brands, to develop and promote new synergistic strategies and businesses, and to expand into new markets and channels. For example, by offering products for sale on a website of an informational entity, retailers can target a captive audience including potential users who have voluntarily engaged with the website. However, because the non-retail entity's website includes a variety of different non-retail-related information and/or products from a variety of different retailers, creative displays and/or interactive media are used in order to draw user attention to a particular product.

SUMMARY OF THE INVENTION

One aspect of the present invention relates to a process for providing a frame layout tool online. The process includes providing commands to display a plurality of wall shape parameter selections. The process also include providing commands to display a first plurality of predetermined frame layout options, in response to receiving a first wall shape parameter selection chosen from the plurality of wall shape parameter selections, each predetermined frame layout option including a representation of a plurality of frames, the representation of the plurality of frames having two or more frame images of different shapes and sizes, and the two or more frame images being arranged in a predetermined pattern. Additionally, the process includes supplying one or more links to a retailer website, in response to receiving a selected predetermined frame layout option chosen from the first plurality of predetermined frame layout options, the one or more links being related to information for purchasing one or more products represented by the two or more frame images included in the representation of the plurality of frames associated with the selected predetermined frame layout option. Other related systems and methods are also described.

BRIEF DESCRIPTION OF THE DRAWINGS

Embodiments of the invention will be described with respect to the figures, in which like reference numerals denote like elements, and in which.

DETAILED DESCRIPTION

The following detailed description of the invention provides examples and is not intended to limit the invention or the application and uses of the invention. Furthermore, there is no intention to be bound by any theory presented in the preceding background of the invention or the following detailed description of the invention.

An online frame layout tool, systems, and associated processes are described herein. The online frame layout tool is interactive and allows a user to view product in a virtual-world context prior to purchasing the product. The online frame layout tool presents product in an eye-catching manner and recommends products for user purchase depending on user end use of the products. Additionally, the tool directs the user to a retailer website for purchasing recommended and similar products and encourages purchase of multiple products during a single visit to the retailer website.

According to an embodiment, the tool is presented in a process that includes displaying a plurality of wall shape parameters for user selection based on shape or other attributes of a wall area a user plans to hang a plurality of framed items. In response to user selection of a wall shape parameter, the tool provides a plurality of predetermined frame layout options. Each predetermined frame layout option includes a plurality of frames, which includes two or more frame images that make up the plurality of frames. The two or more frame includes are displayed as having different shapes and sizes and are arranged in a predetermined pattern. In connection with providing the predetermined frame layout option, links are supplied to a retailer website. The links provide the user with an option to purchase one or more of the frames included in the selected frame layout option. In one example, the frame layout tool is provided and controlled by a computer system.

Figure 1:
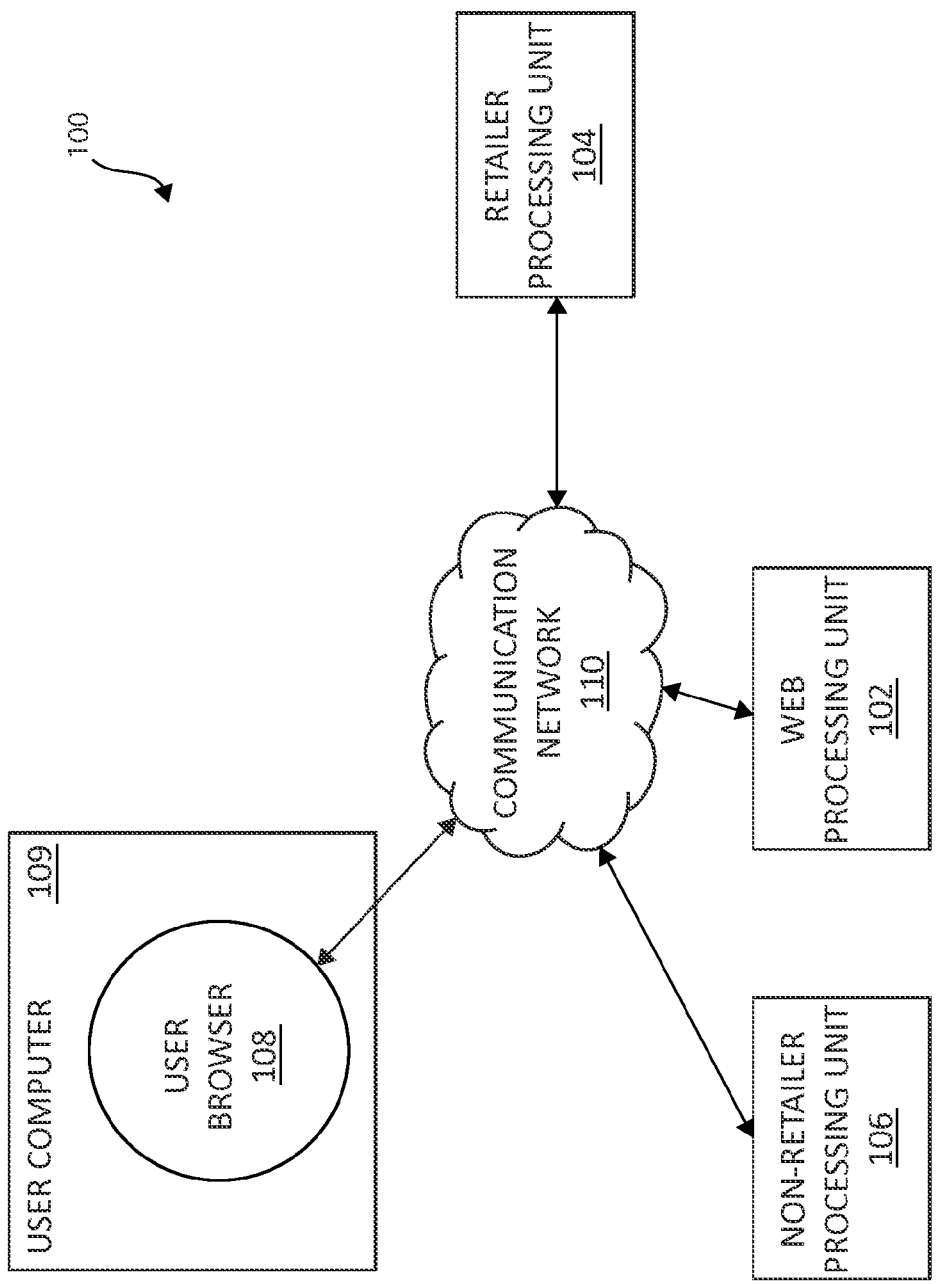
FIG. 1 is a functional block diagram of a computer system, according to one embodiment of the present invention.

Referencing FIG. 1, a computer system 100 is illustrated that is suitable for implementing the online frame layout tool, according to one embodiment of the present application. Computer system 100 includes a web processing unit 102, a retailer processing unit 104, a non-retailer processing unit 106, a user computer 109, and a communication network 110. Web processing unit 102 is in operable communication with retailer processing unit 104 and user browser 108 via communication network 110. User browser 108 is included as part of and is executed by user computer 109, which communicates with non-retailer processing unit 106 via communication network 110 as well.

Web processing unit 102, retailer processing unit 104, non-retailer processing unit 106, and user computer 109 each include separate databases that store various software applications, data to be accessed by the software applications, and the like. The databases comprise various types of memory storage devices, including, but not limited to read access memory (RAM), read-only memory (ROM), etc. Each of web processing unit 102, retailer processing unit 104, non-retailer processing unit 106, and user computer 109 also includes a processor capable of running software applications and accessing the databases. Communication network 110 is any system suitable for allowing web processing unit 102, retailer processing unit 104, non-retailer processing unit 106, and user computer 109 to communicate with each other, e.g., but not limited to, the Internet. Although retailer processing unit 104 and non-retailer processing unit 106 are shown as separate components, they may be integrated into a single component in other embodiments.

In an example, web processing unit 102 provides information via the Internet from retailer processing unit 104 and non-retailer processing unit 106 to websites and webpages accessed by user computer 109. User computer 109 may access a non-retailer website, which causes user computer 109 to communicate with non-retailer processing unit 106. Non-retailer processing unit 106 responds to user computer 109 by instructing user browser 108 on user computer 109 to obtain desired content from web processing unit 102. After user computer 109 accesses web processing unit 102, the desired content is delivered from web processing unit 102 to user computer 109. When user computer 109 wants to obtain product information and/or purchase product from retailer, user computer 109 communicates with retailer processing unit 104 to do so.

As noted above, computer system 100 is employed to implement an online frame layout tool. The online frame layout tool provides templates to a user for arranging a grouping of frames (e.g., picture frames, photo frames, and or other frames used as a border around an item or as a decorative item) in an aesthetically pleasing manner. As appreciated by those with skill in the art, frames have a variety of different configurations and a variety of different sizes. Thus, when a user shops online for frames, the user may have difficulty visualizing how one or more of the frames may be viewed on a wall space of a room or how the frames appear when grouped with other frames or objects. The online frame layout tool alleviates the aforementioned concerns by providing a variety of layouts in which the frames can be arranged and by linking the frames in the layouts to a retailer website for easy purchase.

Figure 2:
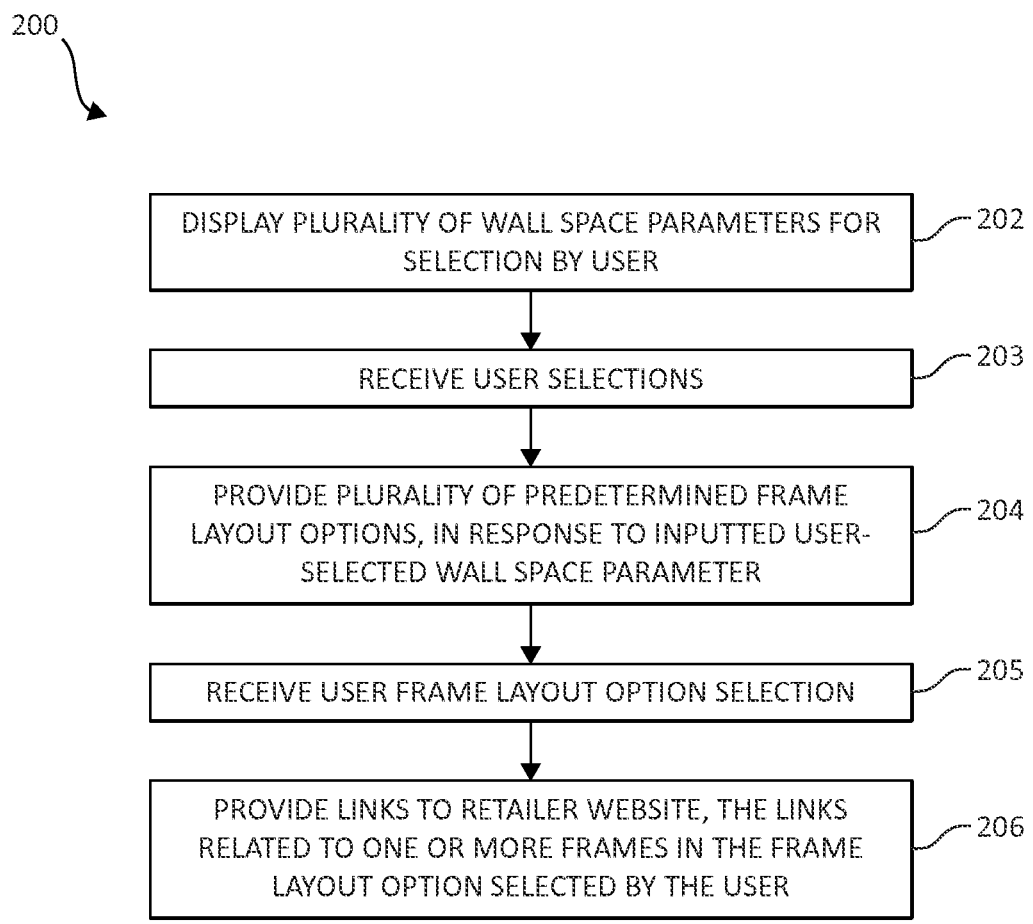
FIG. 2 is a flow chart of a process for providing an online frame layout tool, according to one embodiment of the present invention.
Figure 3:
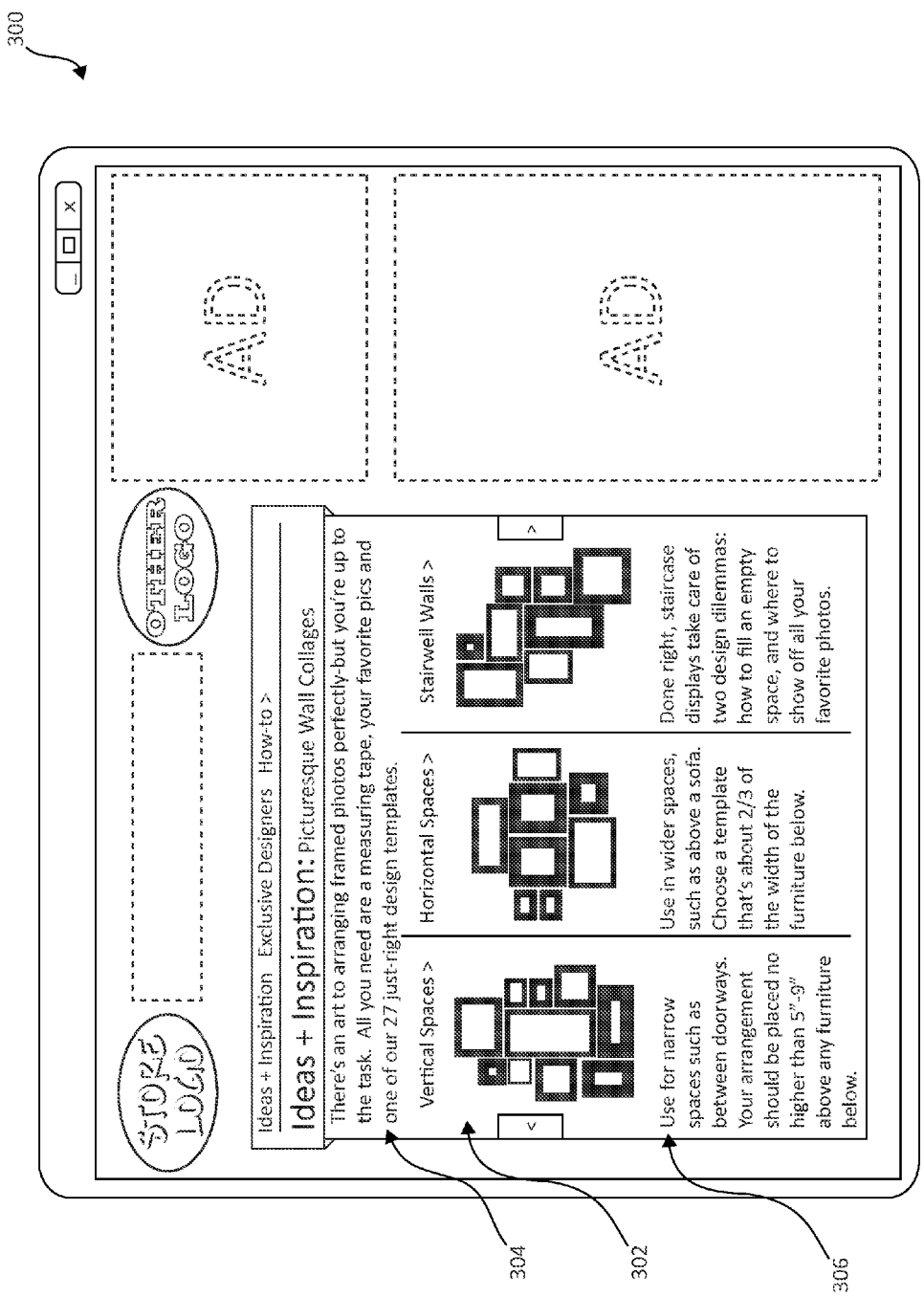
FIGS. 3-11 are illustrations of visual user interfaces showing various configurations of a first website utilizing the process for providing the frame layout tool online, according to one embodiment of the present invention.

Referring now to FIG. 2, the online frame layout tool operates by displaying a plurality of wall shape parameters available for selection by a user at 202. As shown in the screenshot 300 illustrated in FIG. 3, the user accesses a particular website, e.g., a website associated with the non-retailer third party, and selects a webpage on the website that displays one or more images 302 and text presentations 306 identifying an online frame layout tool and/or components thereof. One or more of images 302 includes one or more links that allow the user to begin the online frame layout tool. According to one embodiment, image 302 includes a rectangular window 304 including words making up copy related to an overview of the online frame layout tool. Image 302 can also include sample layouts or wall shape parameters that may be presented during usage of the online frame layout tool. In one example, use of the online frame layout tool is initiated by the user selecting one or more small space parameters (e.g., a wall shape parameter as further described below) presented via images 302 and text presentations 306.

Figure 4:
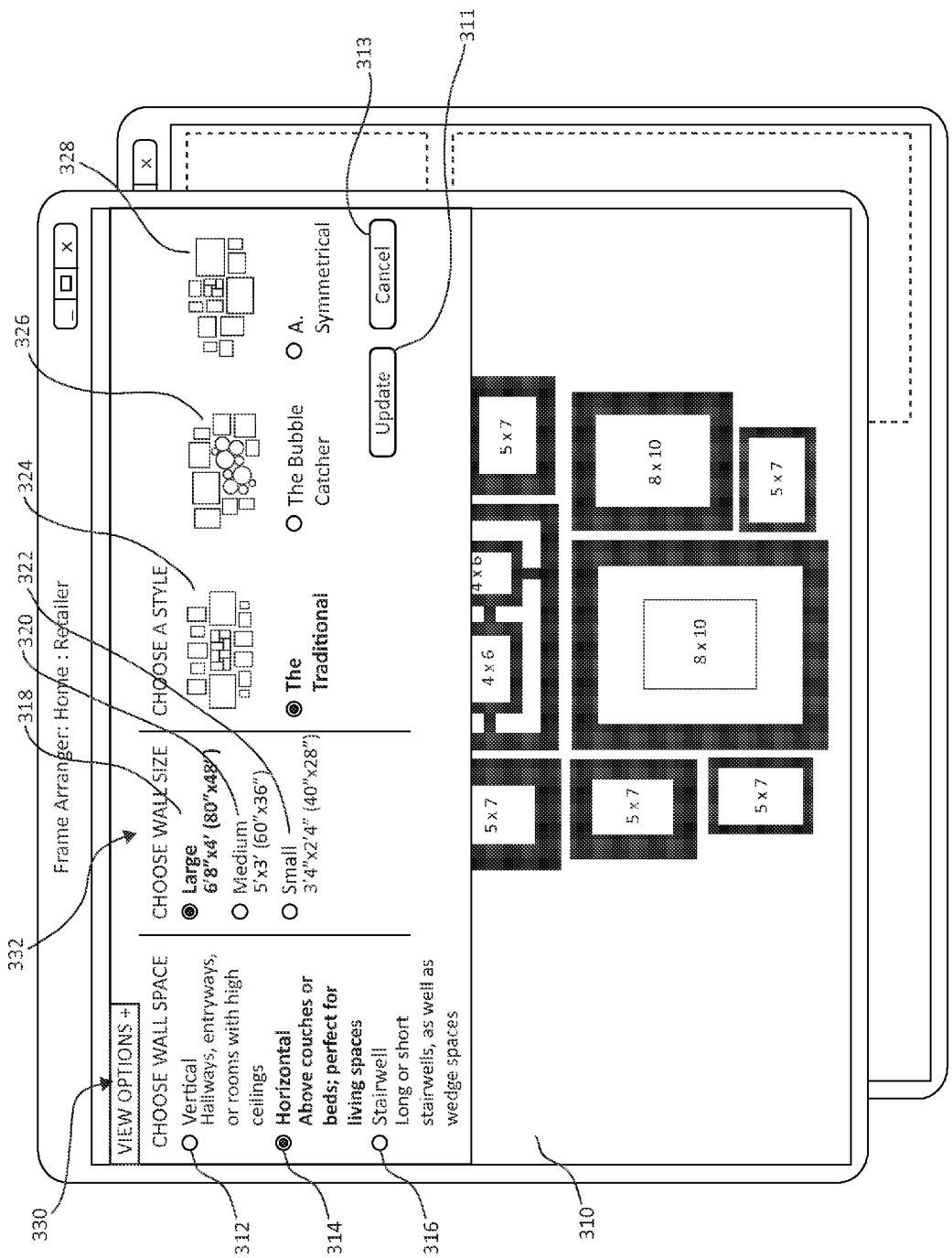

As shown in the embodiment illustrated in FIG. 4, after the user clicks on the link for accessing the online frame layout tool, a pop-up window 310 is displayed. Pop-up window 310 has a first configuration and includes a plurality of predetermined wall shape parameters or wall dimension types 312, 314, 316, 318, 320, and 322 and a plurality of predetermined frame layout options or frame arrangements 322, 324, and 326. Data related to the various predetermined wall shape parameters and frame layout options are stored in databases of retailer processing unit 104 (FIG. 1), non-retailer processing unit 106, and/or web processing unit 102. While described as being presented as a pop-up window 310, alternatively, content of pop-up window 310 may be displayed in original window 304 replacing its original content as will be apparent to those of skill in the art upon reading this application.

Wall shape parameters include parameters that may be particularly useful in determining how one or more frames will appear on a wall. Wall shape parameters can include, but are not limited to parameters such as wall space (e.g., what type of space the wall occupies), wall shape, wall size, and other similar parameters. In other instances, parameters such as room size, room shape, or other characteristics of a room defined by the wall are used.

In an embodiment, plurality of predetermined wall shape parameters 312, 314, 316, 318, 320, and 322 are divided into two categories—namely, wall shape 330 and wall size 332. According to one example, wall shape 330 includes vertical 312, horizontal 314, and stairwell 316 options and corresponding user-input fields (e.g., highlightable bullets or sample layout images) adjacent to or integrated into each option allowing the user to select one of the options. In one example, wall size 332 includes large 318, medium 320, and small 322 options including associated dimensions and corresponding user-input fields (e.g., highlightable bullets) adjacent to each option for user selection. In other embodiments, wall shape 330 and/or wall size 332 include fewer or more than three options each. In one instance, the particular wall size 332 descriptions and/or depictions shown are at least partially dependent upon the selected wall shape 330. That is, the dimensions provided for a large wall size 332 have a larger width than height for a horizontal 314 wall shape 330, but have a smaller width than height for vertical 312 wall shape 330.

In response to the inputted user-selected predetermined wall shape parameter, at 203, a plurality of predetermined frame layout options are provided at 204. According to one embodiment, the plurality of predetermined frame layout options presented to the user depends on the combination of input selections made by the user for wall shape 330 and wall size 332. Thus, for instance, as shown in FIG. 4, where the user has selected horizontal 314 for wall shape 330 and large 318 for wall size 332, pop-up window 310 displays predetermined frame layouts 324, 326, and 328 meeting the selected parameters with corresponding user-input fields adjacent to each frame layout option. In one example, frame layouts 324, 326, and 328 are shown as a generalized depiction of frame sizes and shapes in the respective layout without showing much detail regarding each frame in the layout.

Each predetermined frame layout 324, 326, and 328 includes a representation of a plurality of frames, where two or more images of frames making up the representation of plurality of frames are of different shapes and sizes. As shown in FIG. 4, the frame images included in each of the representation of the plurality of frames are arranged in a predetermined pattern. According to one example, each predetermined frame layout includes an identifying descriptive label (e.g., "The Traditional" 324, "The Bubble Catcher" 326, and the "A. Symmetrical" 328). In other embodiments, the predetermined frame layouts are not labeled and include a selection user-input field.

After the user makes selections for wall shape 330 and wall size 332, the user may wish to change their selection and/or cancel prior selections or use of the frame layout tool. For instance, pop-up window 310 can include one or more input button icons 311 and 313 that the user can click to indicate input of desired selections. In an embodiment, first input button icon 311 is an update button. If the inputted selections do not reflect the user's desired selections, the user deselects the options and/or clicks second input button icon 313 representing a cancel button.

Figure 5:
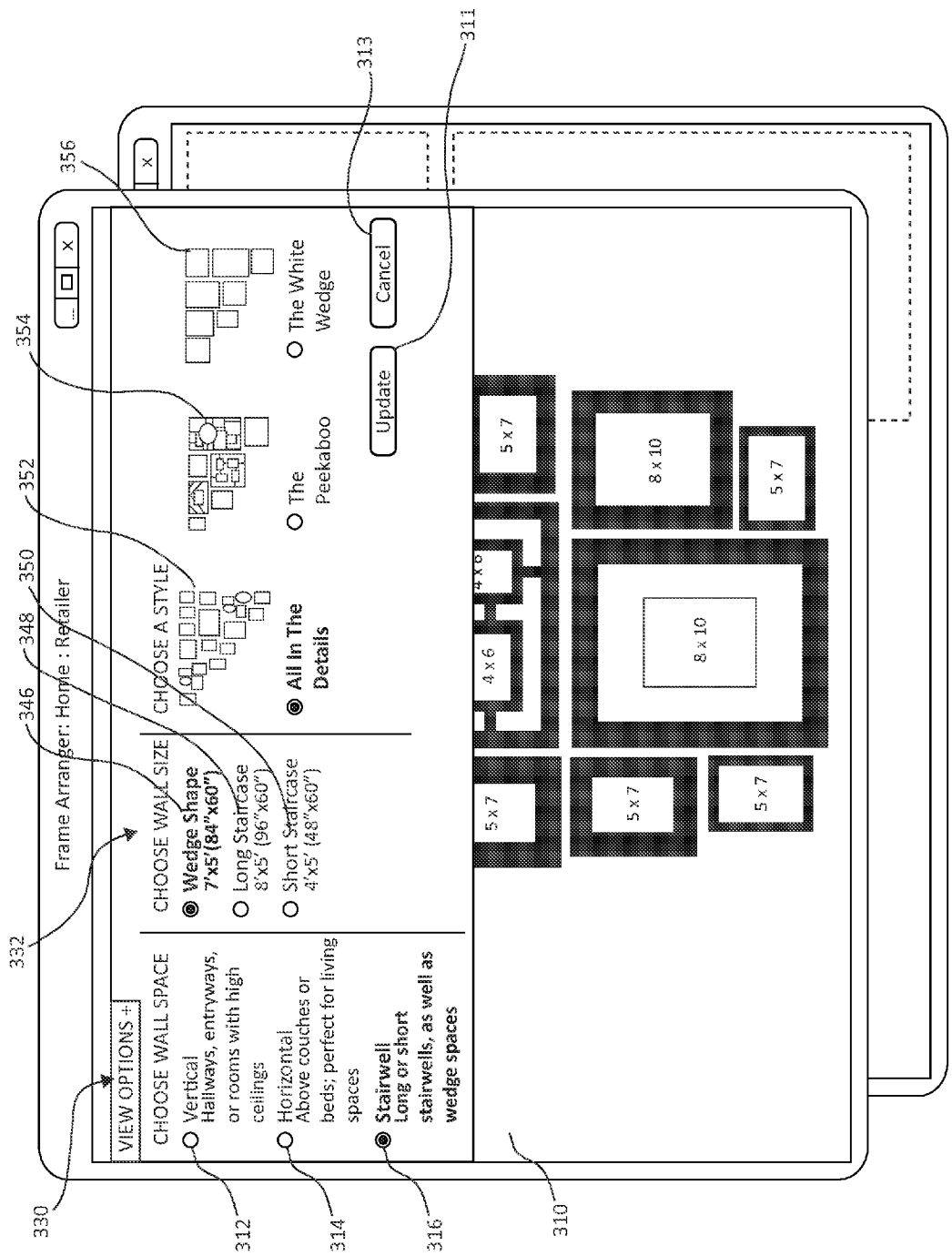

If the user changes a wall shape 330 selection, for example, to stairwell 316, options for wall size 332 selections may correspondingly change. As shown in FIG. 5, pop-up window 310 may have a second configuration similar to the first configuration illustrated in FIG. 3, except that the user has selected stairwell 316 for wall shape 330. As a result, different wall size options, namely, wedge shape 346, long staircase 348, and short staircase 350 are displayed in the second configuration of pop-up window 310. Additionally, user selection of wedge shape 346 for wall size 332 consequently causes another plurality of predetermined frame layout options 352, 354, and 356 to be displayed. Here, each of frame layout options 352, 354 and 356 provides an overall wedge shape appearance; however, each of wedge shape layout option 352, 354 and 356 includes a representation of a plurality of frames arranged in different patterns.

Figure 6:
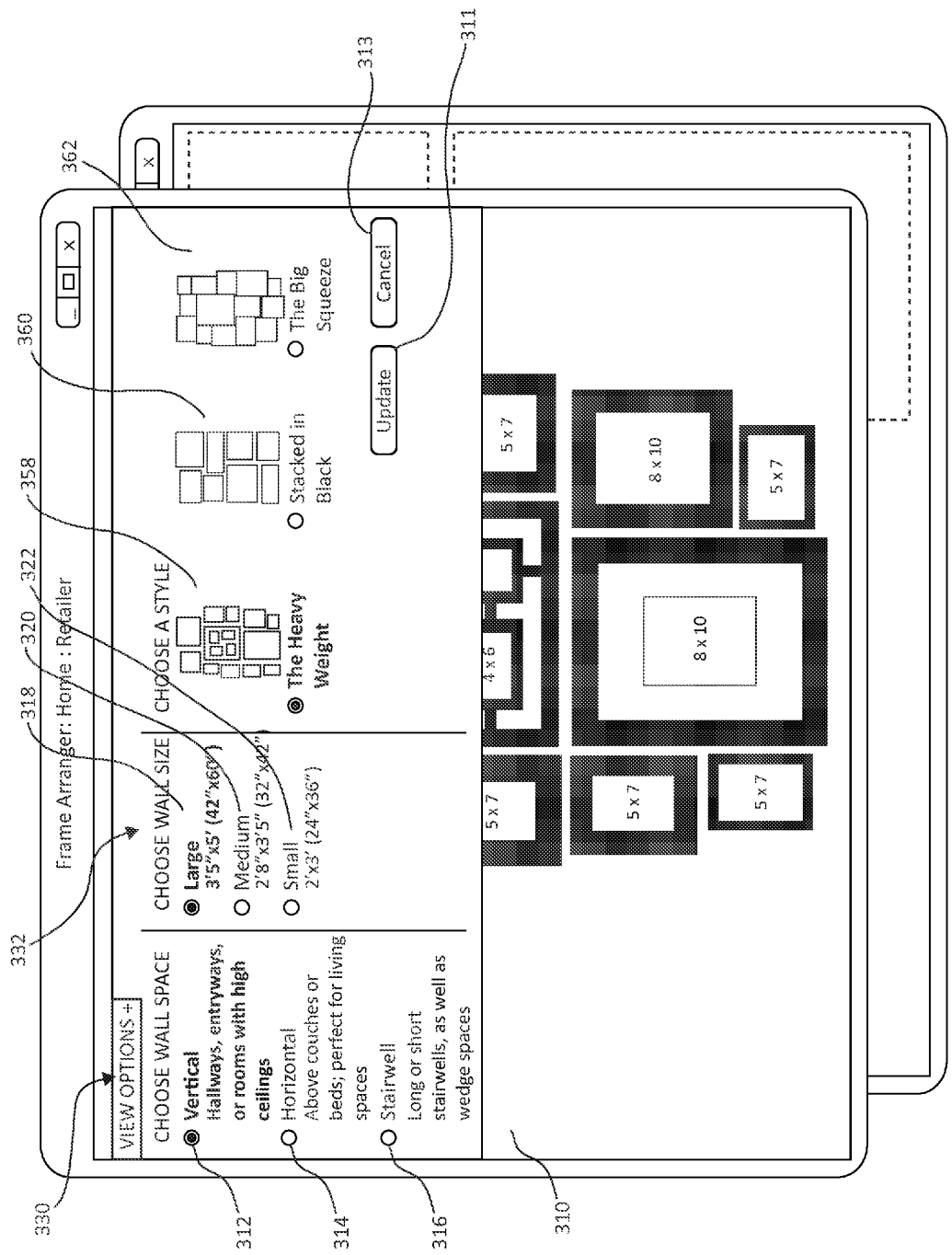
Figure 7:
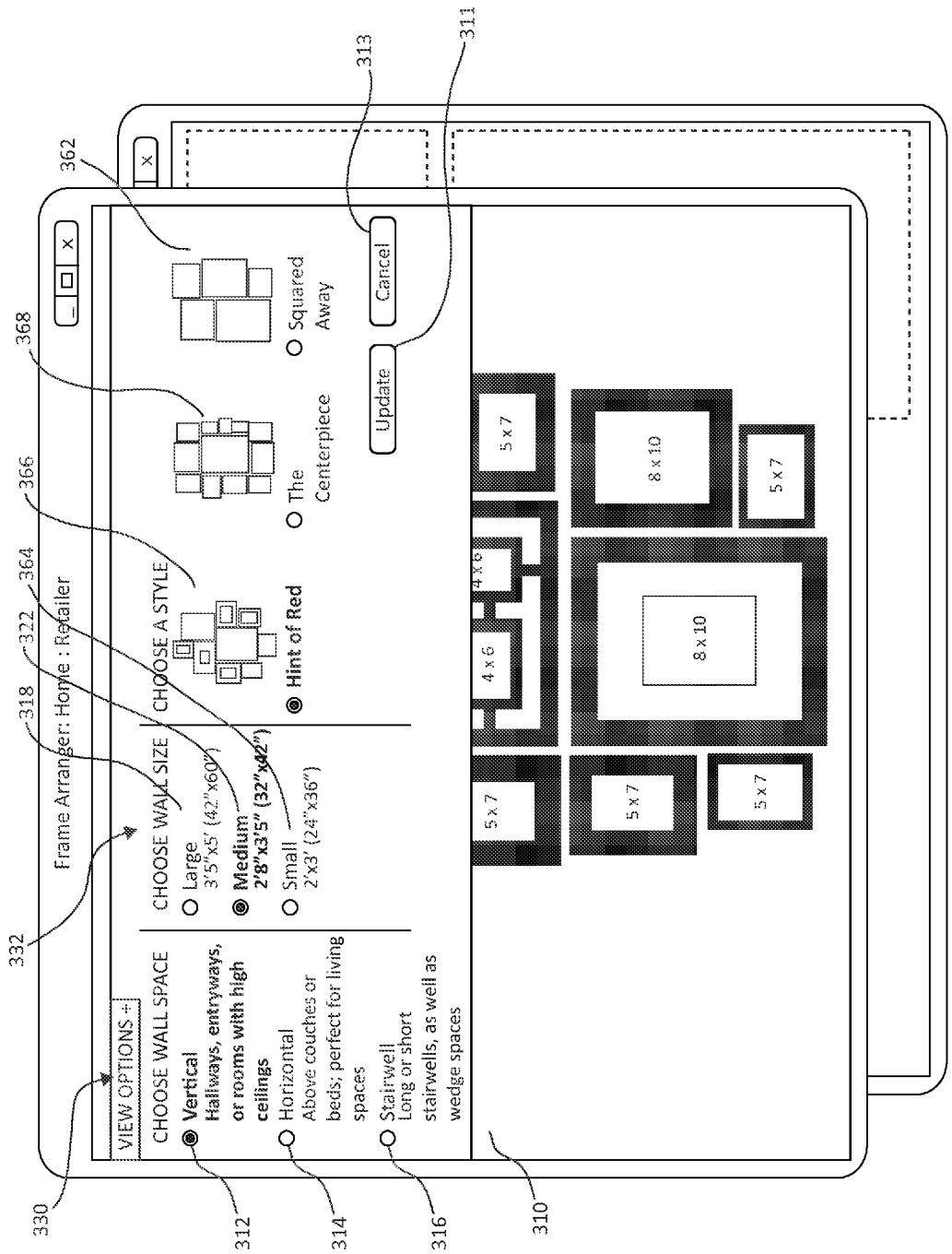
Figure 8:
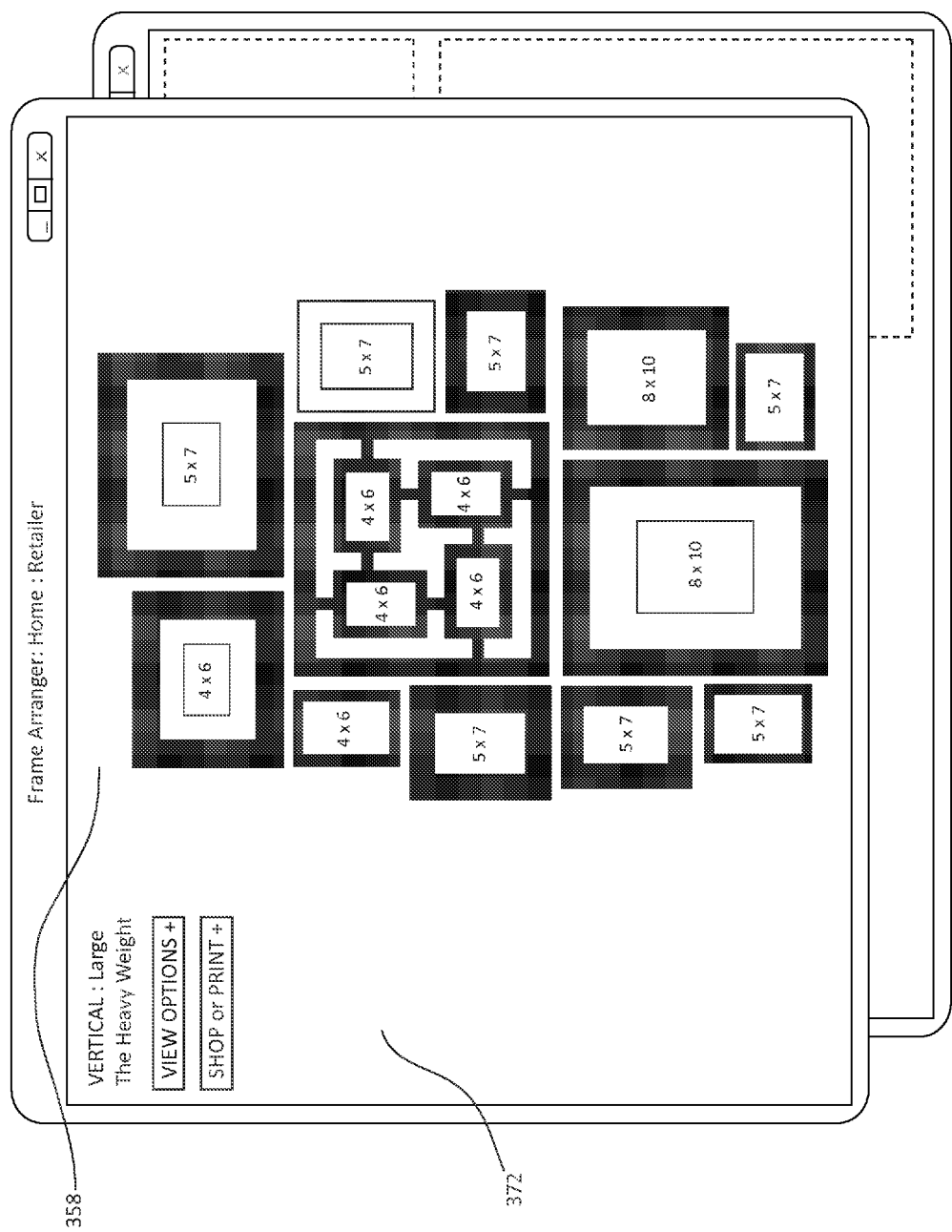

FIGS. 6 and 7 are screen shots illustrating different configurations of pop-up window 310, when the user chooses vertical 312 for wall shape 330 but changes a selection of wall size 332 from one option to another. For example, the user may initially choose large 318 option as shown in FIG. 6. Consequently, pop-up window 310 initially has a first configuration including predetermined frame layout options 358, 360, and 362 (each including a total number of frames suitable for large wall 318). In an embodiment, predetermined frame layout options for large 318 include "The Heavy Weight" layout 358 having twelve differently sized and shaped frames, "Stacked in Black" layout 360 with eight differently sized and shaped frame images, and "The Big Squeeze" layout 362 with fourteen differently sized and shaped frame images. Each predetermined frame layout option 358, 360, and 362 can be viewed in detail by clicking the particular option. For example, when the user clicks "The Heavy Weight" layout 358, a second pop-up window 372 displaying an enlarged and more detailed view of "The Heavy Weight" layout 358 appears over or in place of first pop-up window 310, as shown in FIG. 8.

Figure 9:
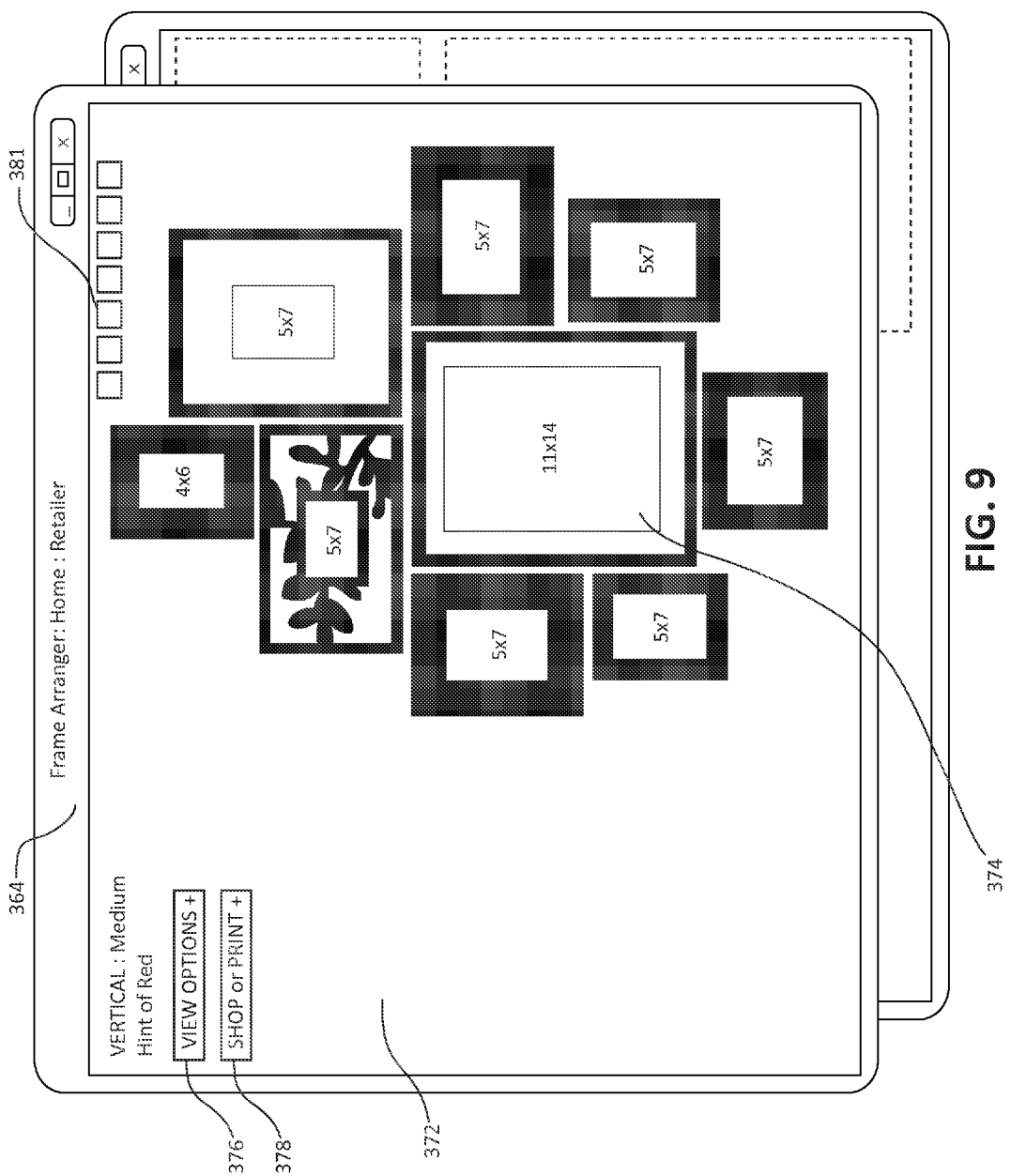

When wall size selection is changed to medium 320, pop-up window 310 has a second, different configuration (FIG. 7) including predetermined frame layout options 364, 366, and 368 (each including a total number of frame images more suitable for medium wall 320). For example, predetermined frame layout options for medium 320 wall size 332 include "Hint of Red" layout 364 having two larger frame images surrounded by seven differently sized and shaped frame images, "The Centerpiece" layout 366 having one larger frame images surrounded by eleven differently sized and shaped smaller frame images, and "Squared Away" layout 368 having five differently sized and shaped frame images. Each predetermined frame layout option 364, 366, and 368 can be viewed in detail by clicking the particular layout option. For example, when the user clicks "Hint of Red" layout 364, at 205, a second pop-up window 372 displaying an enlarged view of "Hint of Red" layout 364 appears over or in place of first pop-up window 310, as shown in FIG. 9.

In addition to selected particular layout option (e.g., "Hint of Red" layout 364 in FIG. 9), second pop-up window 372 includes static input buttons 376, 378, and 381 and links or other objects that appear when the user hovers over one or more of frame images 374 in layout 364. In one example, static input button 376 returns user to first pop-up window 310 when clicked. Although identified as "View Options," static input button 376 has a different label in other embodiments. In another example, static input buttons 381 allow the user to change a background color shown in second pop-up window 372 so the user can view how layout 364 appears against the selected color.

Figure 12:
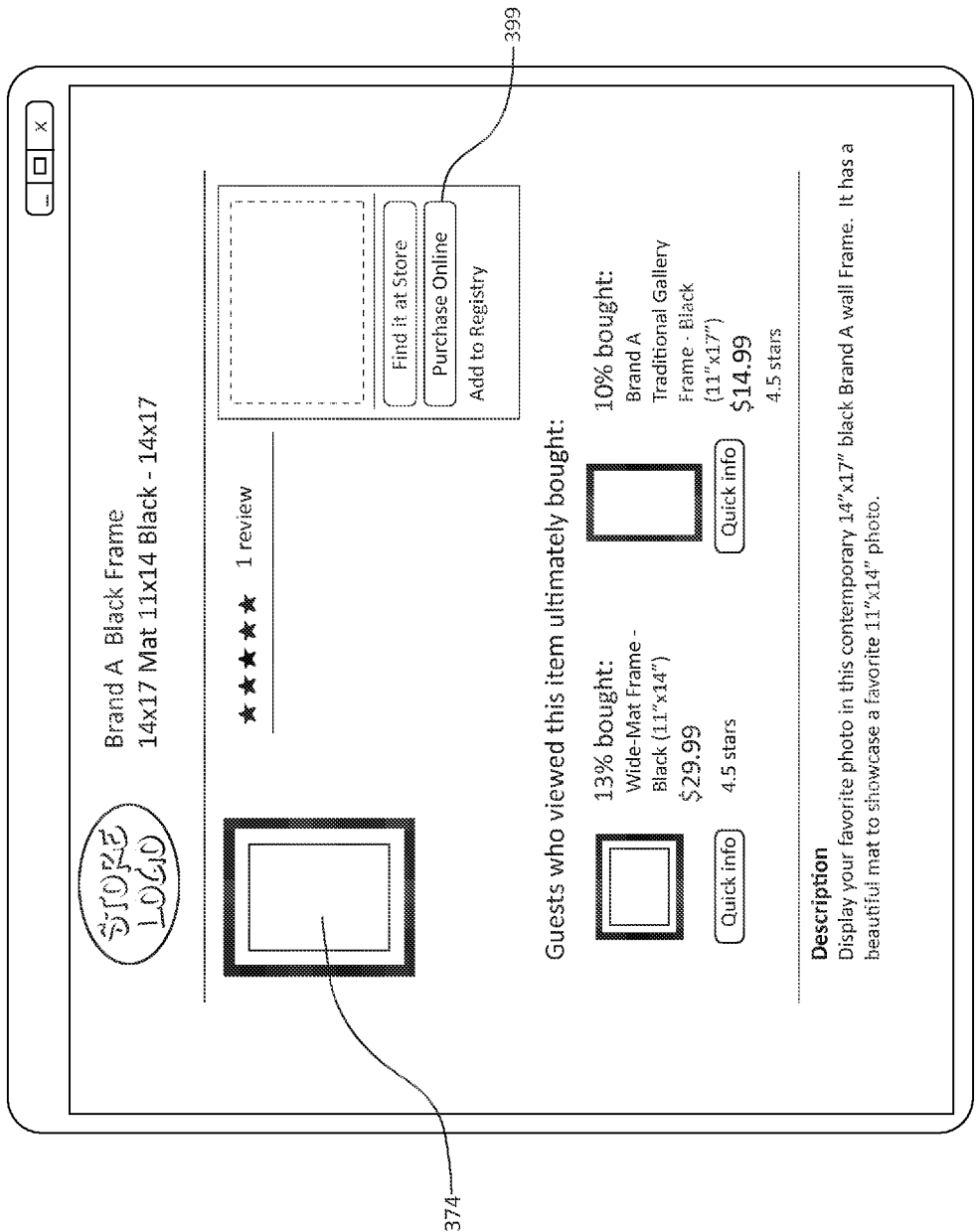
FIG. 12 is an illustration of a visual user interface showing web content of a second website after a selection of a frame included a predetermined frame layout of FIG. 11 is made during the process for providing the online frame layout tool, according to one embodiment of the present invention.

Links to a retailer website are provided, wherein the one or more links are related to information for purchasing one or more frames represented in the predetermined frame layout option selected by the user at 206. In an embodiment, turning now to FIG. 10, an expansion window 380 appears to provide additional options for purchasing the selected particular layout displayed in second pop-up window 372 when the user clicks on static input button 378. In one instance, expansion window 380 provides buttons represented by "Shop This Collage" 382 and "Shop all" frames having a particular size 384. When the "Shop This Collage" button 382 is selected, the embedded link redirects the user to the retailer website and generates a listing of all frame represented by frame images 374 in the selected frame layout option 364 as shown in the screen shot illustrated in FIG. 10. The retailer website includes various information related to each frame in frame images 374, such as a description of each, dimensions of each frame, price information, reviews, frame materials, color, frame finish, and buttons 386 for purchasing frames represented by frame images 374, as illustrated in FIG. 12.

Figure 10:
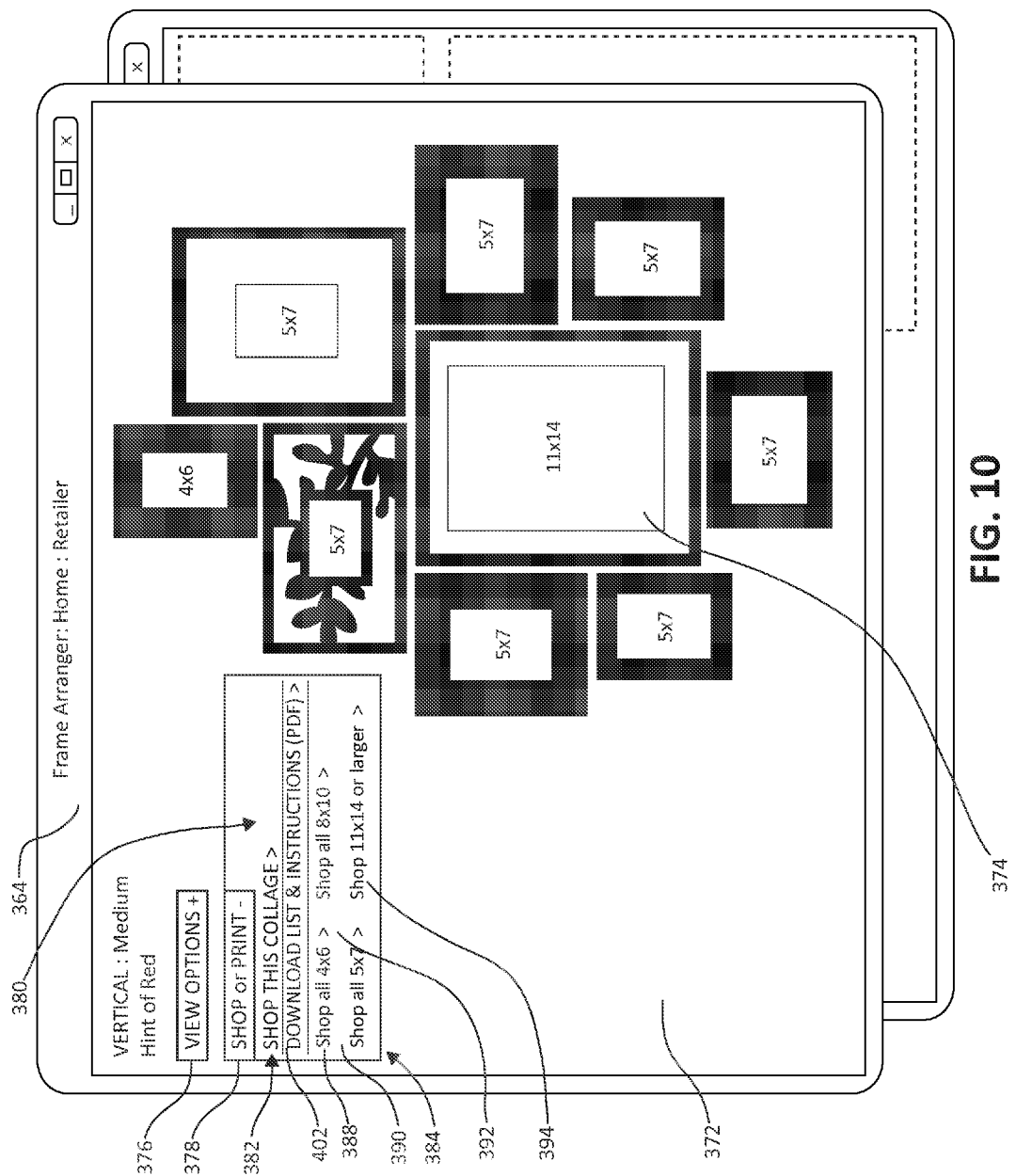

"Shop all" frames buttons 384 allow the user to view all frames for purchase of a particular size that are available at the retailer website. In one example, as illustrated in FIG. 10, "Shop all" frames buttons 384 include buttons for shopping all 4×6 frames 388, 5×7 frames 390, 8×10 frames 392, and 11×14 or larger frames 394. In other embodiments, fewer or more frame size buttons 384 are included. Thus, when the user clicks on 5×7 frames button 390, the user is redirected to the retailer website presenting a listing of all 5×7 frames available for purchase from the retailer, and thereby allowing the user to select alternative, similarly sized frames as alternatives to the frames shown in the selected layout option if desired.

Figure 11:
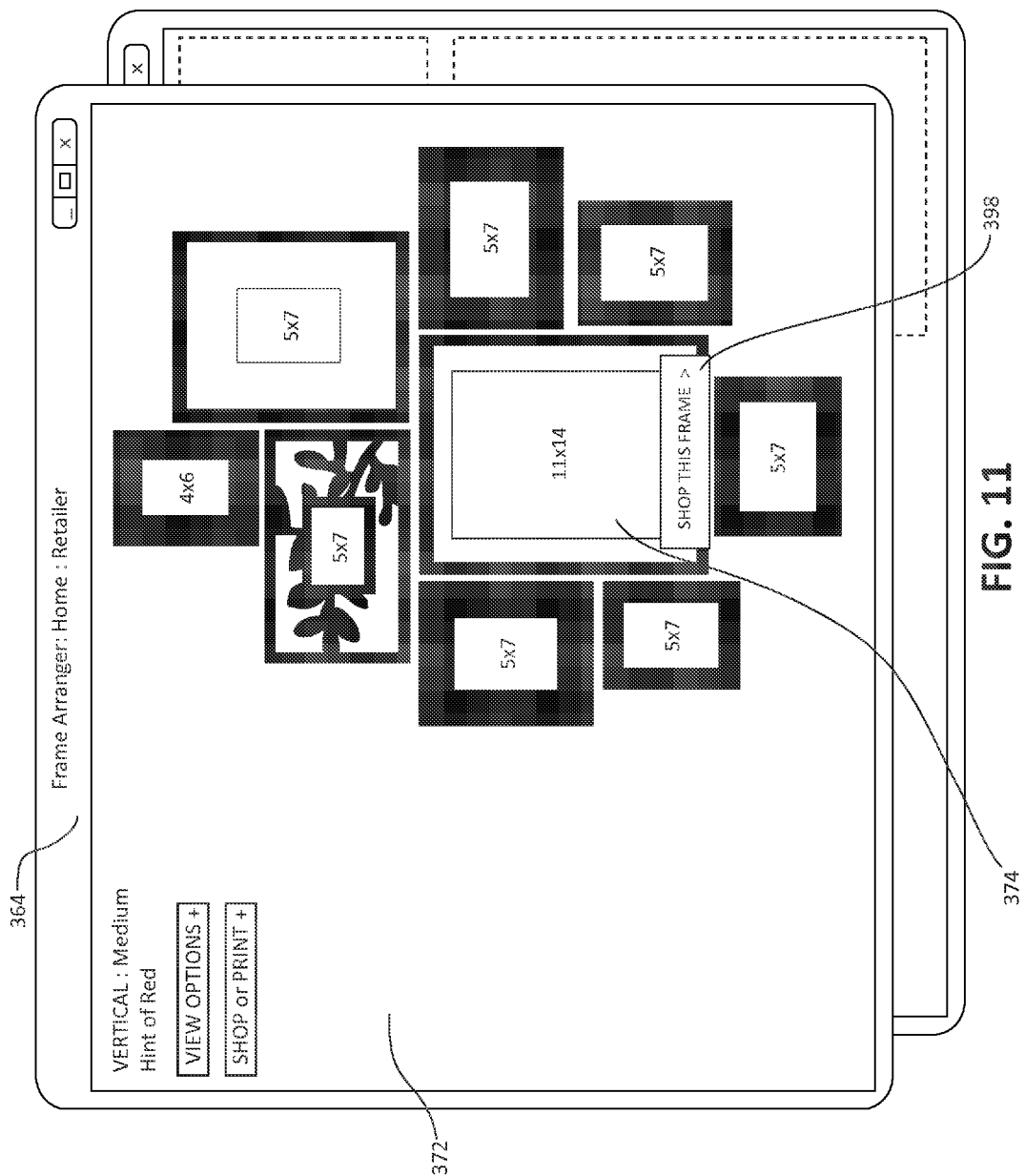

As briefly noted above, second pop-up window 372 includes links or other objects that appear when the user hovers a pointer (not shown) over one or more of frame images 374 in layout 364. For example, an associated link to details relating each frame image 374 in the selected frame layout 364 is presented. One example of such a link is illustrated in FIG. 11, which shows second pop-up window 372 and object 398 over frame images 374. Object 398 provides the user with an option to purchase particular frame image 374 and/or view details for particular frame image 374 when clicked. In particular, when object 398 is clicked, the user is redirected to a webpage on the retailer's website including information related to particular frame image 374 and a button 399 for purchasing the frame represented by frame images 374, as illustrated in FIG. 12.

Figure 13:
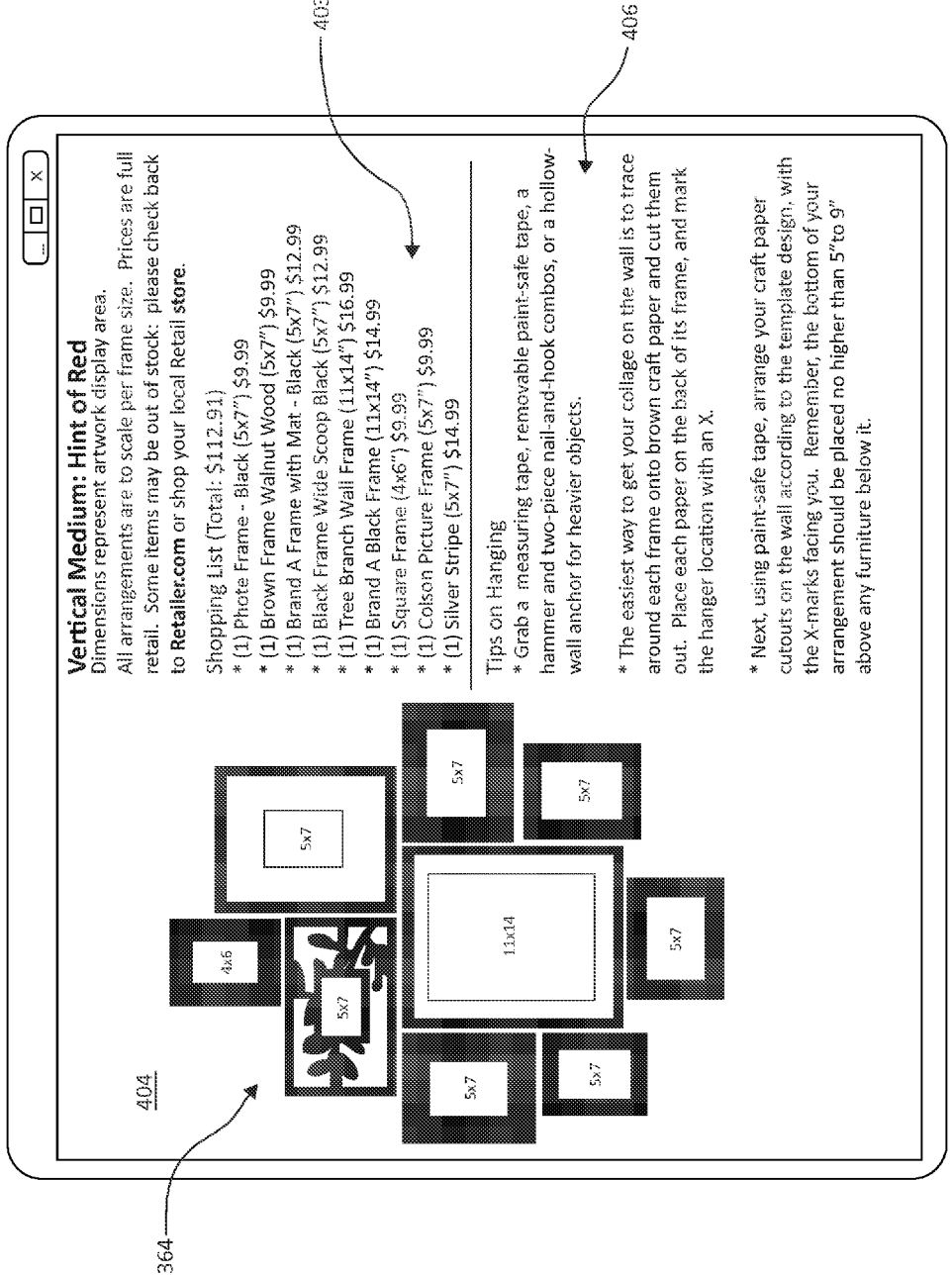
FIG. 13 is an illustration of a document made available by the first website utilizing the process for providing the online frame layout tool, according to one embodiment of the present invention.

Returning to FIG. 10, second pop-up window 372 includes a print button 402 which, when clicked, provides a document 404 (e.g., as illustrated in FIG. 13) including layout 364, a listing 403 of all frames represented by frame images 374 included in layout 364, pricing of all frames represented in layout 364, and a total price of all of the frames represented in layout 364. In an embodiment, document 404 can also include text 406 of additional instructions for hanging frames 374 or other information.

Those with skill in the art will appreciate that various aspects of the present invention may take a different, but substantially similar form than described above. For instance, rather than employing pop-up windows, windows 310 and 372 are different webpages in another embodiment. In another example, buttons (such as buttons 376, 378, and/or 381) shown as static buttons may appear when the user hovers over a particular section of window 310 or 372 or buttons that, when clicked, provide expanded lists, can appear as a plurality of buttons, a separate pop-up window, a new webpage, or another configuration.

The online frame layout tool allows a user to view frames in predetermined frame layouts, which provides a real-word context for the user before making a virtual world purchase. The online frame layout tool provides confidence to the user when the purchase of the selected product is made. Additionally, by presenting predetermined frame layouts and associating the layout directly with a retailer website, the user can easily purchase all or some of the products presented in the layout to thereby encourage purchase of multiple products during a single visit to the retailer website and convert a casual user into a retailer customer.

As will be appreciated by one of ordinary skill in the art, aspects of the present invention may be embodied as a system, method, or computer program product. Accordingly, aspects of the present invention may be embodied entirely as hardware, entirely as software (including firmware, resident software, micro-code, etc.) or as a combination of software and hardware that may all generally be referred to herein as a "system." Furthermore, aspects of the present invention may take the form of a computer program product embodied in one or more computer-readable medium(s) having computer readable program code embodied thereon.

Any combination of one or more computer-readable medium(s) may be utilized. The computer-readable medium may be a computer-readable signal medium or a physical computer-readable storage medium. A physical computer readable storage medium may be, e.g., but not limited to, an electronic, magnetic, optical, crystal, polymer, electromagnetic, infrared, or semiconductor system, apparatus, or device, or any suitable combination of the foregoing. Examples of a physical computer-readable storage medium include, but are not limited to, an electrical connection having one or more wires, a portable computer diskette, a hard disk, RAM, ROM, an EPROM, a Flash memory, an optical fiber, a CD-ROM, an optical storage device, a magnetic storage device, or any suitable combination of the foregoing. In the context of this document, a computer-readable storage medium may be any tangible medium that can contain, or store a program or data for use by or in connection with an instruction execution system, apparatus, or device.

Computer code embodied on a computer-readable medium may be transmitted using any appropriate medium, including but not limited to wireless, wired, optical fiber cable, radio frequency (RF), etc., or any suitable combination of the foregoing. Computer code for carrying out operations for aspects of the present invention may be written in any static language, such as the "C" programming language or other similar programming language. The computer code may execute entirely on the user's computer, partly on the user's computer, as a stand-alone software package, partly on the user's computer and partly on a remote computer or entirely on the remote computer or processing unit. In the latter scenario, the remote computer may be connected to the user's computer through any type of network, or communication system, including, but not limited to, a local area network (LAN) or a wide area network (WAN), Converged Network, or the connection may be made to an external computer (e.g., through the Internet using an Internet Service Provider).

Aspects of the present invention are described above with reference to flow diagrams and/or block diagrams of methods, apparatus (systems) and computer program products according to embodiments of the invention. It will be understood that each block of the flow diagrams and/or block diagrams, and combinations of blocks in the flow diagrams and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flow diagram and/or block diagram block or blocks.

These computer program instructions may also be stored in a computer-readable medium that can direct a computer, other programmable data processing apparatus, or other devices to function in a particular manner, such that the instructions stored in the computer-readable medium produce an article of manufacture including instructions which implement the function/act specified in the flow diagram and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flow diagram and/or block diagram block or blocks.

The flow diagrams and block diagrams in the above figures illustrate the architecture, functionality, and operation of possible implementations of systems, methods and computer program products according to various embodiments of the present invention. In this regard, each block in the flow diagrams or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flow diagrams, and combinations of blocks in the block diagrams and/or flow diagram, can be implemented by special purpose hardware-based systems that perform the specified functions or acts, or combinations of special purpose hardware and computer instructions.

Although the invention has been described with respect to particular embodiments, such embodiments are meant for illustrative purposes only and should not be considered to limit the invention. Various alternatives and changes will be apparent to those of ordinary skill in the art. Other modifications within the scope of the invention and its various embodiments will be apparent to those of ordinary skill.

What is claimed is:

1. A method of operating a processing unit for providing an online frame layout tool comprising:

providing commands to display a plurality of wall shape selections each describing a different possible shape of a wall area, the plurality of wall shape selections including a vertical wall shape selection, a horizontal wall shape selection, and a stairwell wall shape selection;

providing commands to display a plurality of wall size selections corresponding with and further defining the wall area having a first wall shape selection chosen from the plurality of wall shape selections, providing commands to display a plurality of wall size selections including providing commands to display at least a small wall size selection, a medium wall size selection, and a large wall size selection for the first wall shape selection;

providing commands to display a first plurality of predetermined frame layout options, in response to receiving the first wall shape selection chosen from the plurality of wall shape selections and to receiving a first wall size selection, wherein each predetermined frame layout option of the first plurality of predetermined frame layout options includes:
  a representation of a plurality of frames, the representation corresponding only to the different possible shape of the wall area of the first wall shape selection of the plurality of wall shape selections, the representation of the plurality of frames has two or more frame images of different shapes and sizes, the two or more frame images are arranged in a predetermined hanging pattern to fit on the wall area having the different possible shape of the first wall shape selection, and each of the two or more frame images corresponds to one or more prefabricated frame products offered for purchase; and
  supplying one or more links to a retailer website, in response to receiving a selected predetermined frame layout option chosen from the first plurality of predetermined frame layout options, the one or more links being related to information for purchasing the one or more prefabricated frame products corresponding to the two or more frame images included in the representation of the plurality of frames associated with the selected predetermined frame layout option;
  wherein the first plurality of predetermined frame layout options are retrieved from a database storing separate plurality of predetermined frame layout options for each of the following combinations:
    the horizontal wall shape selection and the small wall size selection,
    the horizontal wall shape selection and the medium wall size selection,
    the horizontal wall shape selection and the large wall size selection,
    the vertical wall shape selection and the small wall size selection,
    the vertical wall shape selection and the medium wall size selection,
    the vertical wall shape selection and the large wall size selection,
    the stairwell wall shape selection and the small wall size selection,
    the stairwell wall shape selection and the medium wall size selection, and
    the stairwell wall shape selection and the large wall size selection.

2. The method of claim 1, further comprising:
providing commands to display the plurality of wall shape selections occurs on a first non-retailer website and providing commands to display the first plurality of predetermined frame layout options occurs on a second retailer website.

3. The method of claim 1, further comprising:
providing commands to display a second plurality of predetermined frame layout options, in response to receiving a second wall shape selection chosen from the plurality of wall shape selections.

4. The method of claim 3, wherein the first plurality of predetermined frame layout options is different from the second plurality of predetermined frame layout options.

5. The method of claim 1,
wherein providing the commands to display the plurality of wall size selections occurs in response to receiving the first wall shape selection chosen from the plurality of wall shape selections.

6. The method of claim 1, wherein supplying one or more links includes presenting an associated link to details relating to each of the one or more prefabricated frame products represented by each frame image in the selected predetermined frame layout option.

7. The method of claim 1, wherein the one or more prefabricated frame products each include a prefabricated frame for purchase, and the method further comprises:
generating a list of available prefabricated frames for purchase, each of the available prefabricated frames in the list of available prefabricated frames having a shape and a size matching a selected frame represented in the selected predetermined frame layout option.

8. The method of claim 1, further comprising:
generating a list including identifying information related to each frame of the plurality of frames represented in the selected predetermined frame layout option, wherein each frame is prefabricated.

9. The method of claim 1, further comprising:
generating a list including pricing information related to each frame of the plurality of frames represented in the selected predetermined frame layout option.

10. The method of claim 1, further comprising:
providing a command to present a first pop-up window including the plurality of wall shape selections and the first plurality of predetermined frame layout options.

11. The method of claim 10, further comprising:
changing the first pop-up window from a first configuration including the plurality of wall shape selections and the first plurality of predetermined frame layout options associated with a first wall shape selection to a second configuration including the plurality of wall shape selections and a second plurality of predetermined frame layout options associated with a second wall shape selection.

12. The method of claim 11, further comprising:
displaying a second pop-up window having a third configuration including an enlarged view of the selected predetermined frame layout option.

13. The method of claim 12, wherein the third configuration includes the one or more links to the retailer website.

14. The method of claim 12, further comprising:
providing a third pop-up window including a list of identifying information for frames represented in the selected predetermined frame layout option.

15. The method of claim 14, wherein the third pop-up window further includes instructions on hanging the frames on a wall space.

16. The method of claim 12, wherein the third configuration includes one or more static input buttons for providing an option to change the selected predetermined frame layout option to another predetermined frame layout option.

17. The method of claim 12, wherein the third configuration includes an object that appears when user input is provided over a frame image included in the selected predetermined frame layout option displayed in the second pop-up window.

18. A system for presenting a proposed arrangement of multiple frames to a user contemplating hanging a group of frames in a wall area, the system comprising:
  a database storing a plurality of different wall shapes, a plurality of different wall sizes, and a plurality of predetermined frame arrangements, wherein each of the plurality of predetermined frame arrangements includes a different representation of multiple frames in a recommended hanging pattern, and each of the plurality of predetermined frame arrangements corresponds to one different wall shape and different wall size combination; and a processor configured, in response to input received via a first website, to:
- provide a first instruction for displaying via the first website the plurality of different wall shapes and prompting user selection of one of the plurality of different wall shapes corresponding with a shape of the wall area the user is contemplating hanging a group of frames;
- in response to a user selection of one of the plurality of different wall shapes, provide a second instruction for displaying via the first website the plurality of different wall sizes corresponding to the user selection of one of the plurality of different wall shapes and prompting user selection of one of the plurality of different wall sizes corresponding with a size of the wall area the user is contemplating hanging the group of frames;
- in response to the user selection of one of the plurality of different wall shapes and a user selection of one of the plurality of different wall sizes, generate a third instruction for providing via the first website only ones of the plurality of predetermined frame arrangements corresponding to the user selections of the one of the plurality of different wall shapes and the one of the plurality of different wall sizes, and
- produce a fourth instruction for supplying links via the first website, the links corresponding to information for purchasing one or more frames represented in one predetermined frame arrangement chosen by the user from the only ones of the plurality of predetermined frame arrangements.

19. The system of claim 18, wherein:
each predetermined frame arrangement of the plurality of predetermined frame arrangements includes a representation of a plurality of prefabricated frames, and
the plurality of prefabricated frames are each offered for sale on a retailer website and not offered for sale on the first website, the first website being operated by a non-retailer.

20. A non-transitory computer storage medium comprising a computer program product method for providing an online frame layout tool to guide a user in arranging multiple framed objects on a wall, the physical computer storage medium comprising:
- computer code for providing commands to display a plurality of possible wall shape selections to the user, the plurality of possible wall shape selections including a vertical wall shape selection, a horizontal wall shape selection, and a stairwell wall shape selection;
- computer code for providing commands to display a plurality of possible sizes for a first wall shape selection, wherein the first wall shape selection is chosen by the user from the plurality of possible wall shape selections, the plurality of possible sizes including a small wall size selection, a medium wall size selection, and a large wall size selection for the first wall shape selection;
- computer code to display a plurality of predetermined frame layouts corresponding to the first wall shape selection and a first wall size selection, wherein the first wall size selection is chosen by the user from the plurality of possible sizes for the first wall shape selection, each predetermined frame layout includes a representation of a plurality of frames, each representation of the plurality of frames includes two or more frame images having different shapes and sizes, the two or more frame images of the representation of the plurality of frames are arranged in a predetermined pattern to fit a wall area shaped to correspond with the first wall shape selection, and the computer code to display the plurality of predetermined frame layouts includes computer code to retrieve the plurality of predetermined frame layouts from a database storing a separate plurality of predetermined frame layout options for each of the following combinations:
  - the horizontal wall shape selection and the small wall size selection,
  - the horizontal wall shape selection and the medium wall size selection,
  - the horizontal wall shape selection and the large wall size selection,
  - the vertical wall shape selection and the small wall size selection,
  - the vertical wall shape selection and the medium wall size selection,
  - the vertical wall shape selection and the large wall size selection,
  - the stairwell wall shape selection and the small wall size selection,
  - the stairwell wall shape selection and the medium wall size selection, and
  - the stairwell wall shape selection and the large wall size selection;
- computer code for providing commands to display a selected predetermined frame layout selected by the user from the plurality of predetermined frame layouts; and
- computer code for supplying a link to a retailer website, the link corresponding to information related to purchasing one or more prefabricated frame products associated with the two or more frame images included in the selected predetermined frame layout.

21. The non-transitory computer readable medium of claim 20, further comprising:
computer code for redirecting to the retailer website in response to receiving input via the link.

* * * * *